United States Patent [19]
Roberson, Jr. et al.

[11] Patent Number: 5,848,933
[45] Date of Patent: *Dec. 15, 1998

[54] DOCKING AND ENVIRONMENTAL PURGING SYSTEM FOR INTEGRATED CIRCUIT WAFER TRANSPORT ASSEMBLIES

[75] Inventors: Glenn A. Roberson, Jr., Hollister, Calif.; Robert M. Genco, Atlanta; G. Kyle Mundt, Duluth, both of Ga.

[73] Assignee: Semifab, Incorporated, Hollister, Calif.

[ * ] Notice: The term of this patent shall not extend beyond the expiration date of Pat. No. 5,674,123.

[21] Appl. No.: 916,021

[22] Filed: Aug. 21, 1997

Related U.S. Application Data

[63] Continuation of Ser. No. 503,677, Jul. 18, 1995, Pat. No. 5,674,123.

[51] Int. Cl.⁶ .................................................. H01L 23/24
[52] U.S. Cl. ........................ 454/187; 414/222; 414/940
[58] Field of Search ........................... 454/187; 414/217, 414/222, 935, 940

[56] References Cited

U.S. PATENT DOCUMENTS

| | | |
|---|---|---|
| 4,616,683 | 10/1986 | Tullis et al. . |
| 4,705,444 | 11/1987 | Tullis et al. ............................. 414/226 |
| 4,728,389 | 3/1988 | Logar . |
| 4,863,561 | 9/1989 | Freeman et al. . |
| 4,957,781 | 9/1990 | Kanegae et al. . |
| 5,026,239 | 6/1991 | Chiba et al. . |
| 5,032,545 | 7/1991 | Doan et al. . |
| 5,145,303 | 9/1992 | Clarke ................................. 454/187 X |
| 5,219,464 | 6/1993 | Yamaga et al. ..................... 454/187 X |
| 5,354,198 | 10/1994 | Yates ............................................ 432/5 |
| 5,373,806 | 12/1994 | Logar . |
| 5,413,527 | 5/1995 | Dansui et al. ...................... 454/187 X |
| 5,431,600 | 7/1995 | Murata et al. .......................... 454/187 |

FOREIGN PATENT DOCUMENTS

| | | |
|---|---|---|
| 0 358 443 | 3/1990 | European Pat. Off. . |
| 1-22429 | 9/1989 | Japan . |
| 5-299312 | 11/1993 | Japan ..................................... 454/187 |

*Primary Examiner*—Harold Joyce
*Attorney, Agent, or Firm*—Fulwider Patton Lee & Utecht. LLP

[57] ABSTRACT

The docking and purging system docks a modular isolation container for substrates used in manufacturing integrated circuits for purging and processing in a processing environment. A door portion of the docking and purging system includes a shelf for receiving the modular isolation container before insertion in a docking chamber formed in the housing connected for communication with the processing environment. A vacuum manifold with suction cups is provided for gripping and removing the modular isolation container door to allow access to the interior chamber of the modular isolation container. The docking chamber and interior chamber of the modular isolation container can also be purged of particulate contaminates by filtered air or inert gas ducted to the docking chamber.

6 Claims, 9 Drawing Sheets

DOCKING AND ENVIRONMENTAL PURGING SYSTEM FOR INTEGRATED CIRCUIT WAFER TRANSPORT ASSEMBLIES

This is a continuation of application Ser. No. 08/503,677, filed Jul. 18, 1995 U.S. Pat. No. 5,674,123.

BACKGROUND OF THE INVENTION

1. Field of the Invention:

This invention relates generally to systems for semiconductor fabrication, and more particularly concerns a docking and environmental purging system for docking a side loading or bottom loading modular isolation container for substrates used in manufacturing integrated circuits within a processing environment, for removal of a door of the modular isolation container, and for purging such a modular isolation container of particulate contaminates in the docking procedure.

2. Description of Related Art:

Modular isolation containers have been designed that provide a microenvironment to isolate and control the environment surrounding a wafer, cassette of wafers or substrates used in manufacturing integrated circuits. Such containers are commonly side loading or bottom loading, and are used to protect contaminate sensitive products such as wafers, masks, ceramic substrates and flat panel displays during processing and shipping.

Processing of such materials has been conventionally carried out in a particulate free environment generally known as a "clean room". Maintenance of such "clean rooms" in a contaminate free state can require a great deal of care and effort, particularly during processing of the materials. Where human operators are used for transferring the materials from such modular isolation containers, such as to a robot operated processing environment, the operator is typically required to wear bulky protective suits and helmets preventing the operator from introducing particulate contaminates into the processing environment.

It would therefore be desirable to provide a system for docking a modular isolation container, for either manually or robotically removing a side or bottom door of the modular isolation container. It would also be desirable that such a system provide for purging materials within the container of particulate contaminates, for transferring such materials from the localized modular isolation container environment to a clean robot operated processing environment, and that the system be centered around existing modular isolation containers to allow processing in smaller, controlled environments free of contaminates, contained within an otherwise high particulate environment in which an operator can freely work and move about. The present invention meets these needs.

SUMMARY OF THE INVENTION

Briefly, and in general terms, the present invention provides for an improved system for transferring materials such as wafers, cassettes of wafers or substrates used in manufacturing integrated circuits from a localized modular isolation container environment to a clean processing environment, to allow processing of the materials in small, controlled and isolated environments free of contaminates, contained within an otherwise high particulate environment, in which an operator can freely work and move about, and for purging such materials of particulate contaminates prior to processing of the materials.

The invention accordingly provides for a docking and environmental purging system and associated valving for purging a modular isolation container for substrates used in manufacturing integrated circuits of particulate contaminates and docking the modular isolation container with a processing environment free of particulate contaminates. The modular isolation container has an interior chamber for isolating the substrates from an environment exterior to the modular isolation container. The modular isolation container typically has at least one door to the interior chamber for sealing the interior chamber from the ambient environment, and allowing access to the contents of the interior chamber. The docking and environmental purging system comprises a main housing defining a docking chamber connected for communication with- the processing environment for receiving the modular isolation container. A door portion of the docking and purging system is also pivotally connected to the housing, and a shelf is typically hingedly mounted to the door portion. The housing is typically mounted to or adjacent to a wall of the processing environment to provide contaminate free, sealed access to the processing environment.

Means are provided for removing the modular isolation container door, which can open either from the side or the bottom, to allow access to the interior chamber of the modular isolation container when the modular isolation container is disposed in the docking chamber. In one currently preferred embodiment, the means for removing the modular isolation container door comprises a source of vacuum, a hollow vacuum manifold connected to the source of vacuum, and a plurality of suction cups connected to the source of vacuum through the vacuum manifold, for gripping the door, and for moving the door from a first closed position to a second open position providing access to the interior of the modular isolation chamber.

Means are also provided for purging the contents of the interior chamber of the modular isolation container of particulate contaminates. In one currently preferred embodiment, the purging means comprises a source of ambient air, a blower, an air duct and a filter for providing a purging flow of filtered air.

In another presently preferred embodiment, the purging means comprises a gas manifold connected to a source of an inert purge gas, such as nitrogen. Means are also preferably provided for controlling or operating the purging means and the means for removing the modular isolation container door.

These and other aspects and advantages of the invention will become apparent from the following detailed description, and the accompanying drawing, which illustrates by way of example the features of the invention.

DETAILED DESCRIPTION OF A PREFERRED EMBODIMENT

Figures 1, 2:
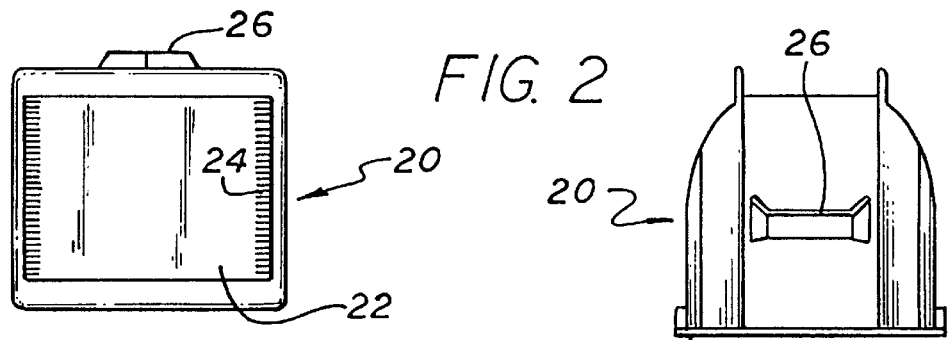
FIG. 1 is a front elevational view of a modular isolation container for use with the docking and environmental purging system of the invention.
FIG. 2 is a top plan view of the modular isolation container of FIG. 1.

As is illustrated in the drawings, in which like elements are identified with like reference numerals, the invention is embodied in a docking and environmental purging system for docking a modular isolation container for substrates used in manufacturing integrated circuits with a processing environment, removal of a side or bottom loading door of the modular isolation container, and for purging the modular isolation container of particulate contaminates. The docking and environmental purging system includes associated valving, and permits the transfer of such substrate materials from a localized modular isolation container transport container environment to a processing environment.

With reference to FIGS. 1 and 2, the docking and environmental purging system is useful for docking a modular isolation container with a processing environment free of particulate contaminates for transferring semiconductor manufacturing materials contained in the modular isolation container, such as wafers, cassettes of wafers or substrates used in manufacturing integrated circuits, to a clean processing environment. The docking and environmental purging system is also useful for purging the modular isolation container of particulate contaminates prior to and/or during the transfer of materials from the modular isolation container.

As is shown in FIGS. 1 and 2, a modular isolation container 20 typically has an interior chamber 22 for isolating the substrates or wafers from the environment exterior to the modular isolation container. The interior chamber typically is provided with slots 24 for receiving and holding the wafers or substrates, a handle 26 to allow manual carrying and handling of the modular isolation container, and at least one vertical or horizontal loading door 28 to the interior chamber for sealing the interior chamber and providing access to the materials within the modular isolation container. One currently preferred type of modular isolation container for use with the docking and purge system of the invention is a modular isolation capsule available from EMPAK of Colorado Springs, Colo. under the trade name MiC. The modular isolation container is preferably hermetically sealed, may have a continuous inert gas purge system, and can have single or dual doors that open to the side or bottom of the container.

Figure 3:
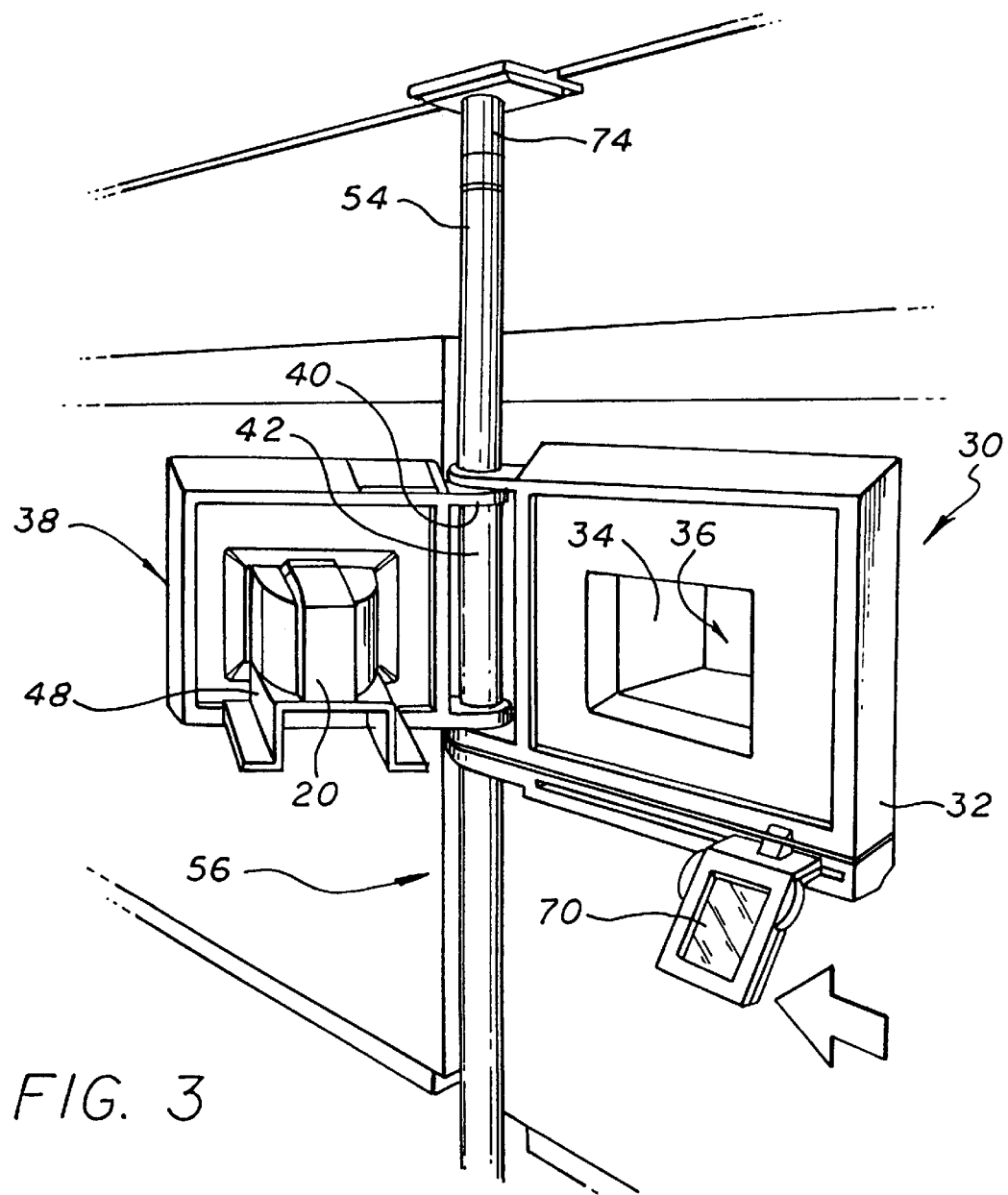
FIG. 3 is a perspective view of a first embodiment of a pole mounted docking and environmental purging system according to the principles of the invention.
Figure 4:
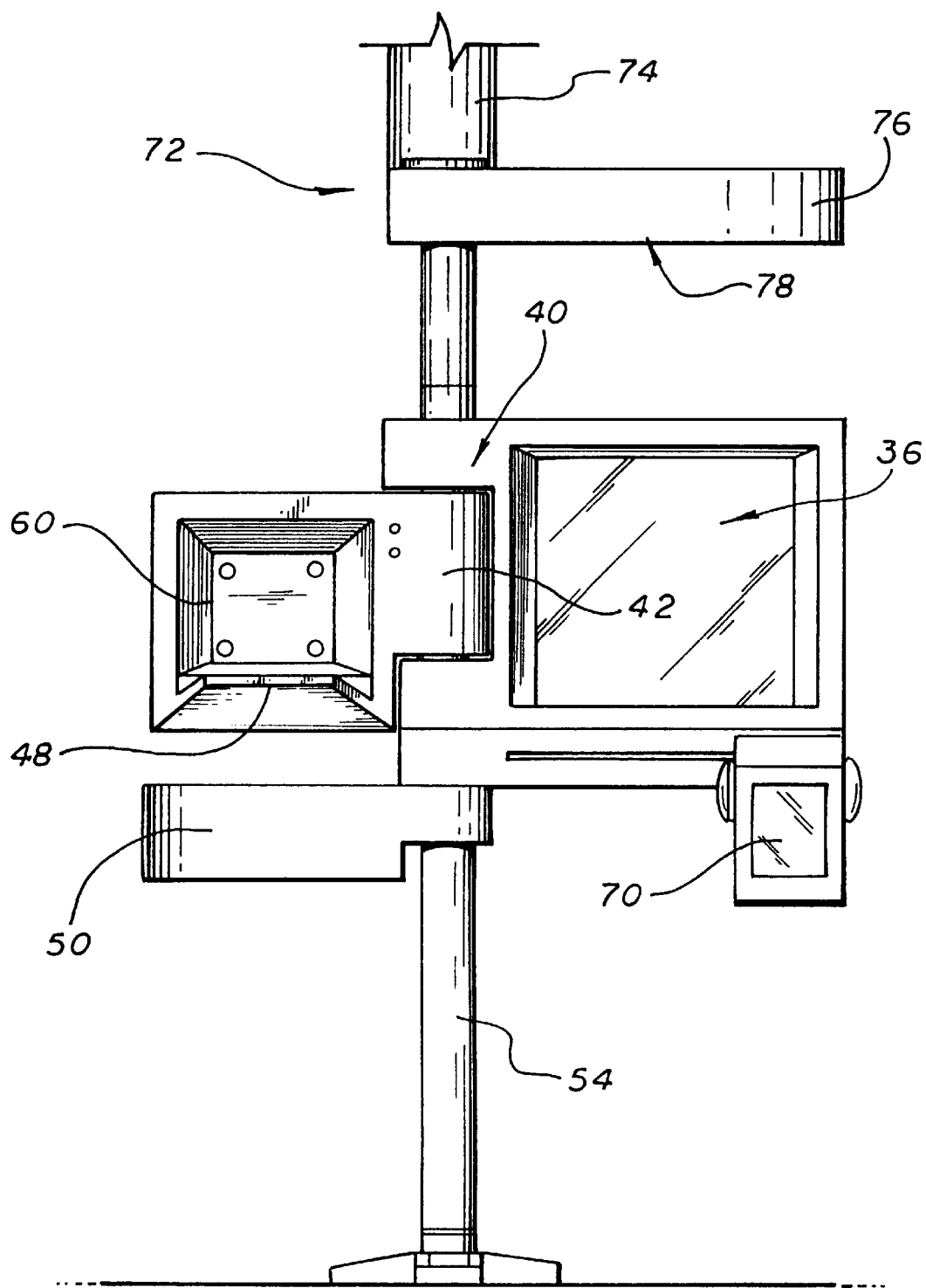
FIG. 4 is a front elevational view of a second embodiment of a pole mounted docking and environmental purging system according to the principles of the invention.

Referring to FIGS. 3 to 6, the docking and environmental purging system 30 preferably includes a main housing 32 defining a docking chamber 34 for receiving the modular isolation container for transferring the substrate materials to be fabricated into integrated circuits. The docking chamber provides a passageway to, and is connected for communication with the processing environment, such as with a window 36 in a processing clean room (not shown) with an elevator (not shown) for transporting the modular isolation container within the processing clean room. A door portion 38 is connected to the main housing by a hinge 40, provided by the pole 42 in FIGS. 3 and 4, and provided by the suspended support 44 in FIGS. 5 and 6. The door portion pivots between an open and a closed position, receives the modular isolation container in the ambient environment in the open position, and forms a front cover 46 for the window to the clean room processing environment in the closed position. The door portion preferably is connected to the housing by a side hinge, although the door portion can alternatively be connected to the door portion of the housing by a bottom hinge. In a currently preferred embodiment, the door portion includes a shelf 48 extending horizontally from the door portion for receiving the modular isolation container. As is illustrated in FIG. 4, a storage or work surface 50 connected to the main housing can also be provided.

Figure 5:
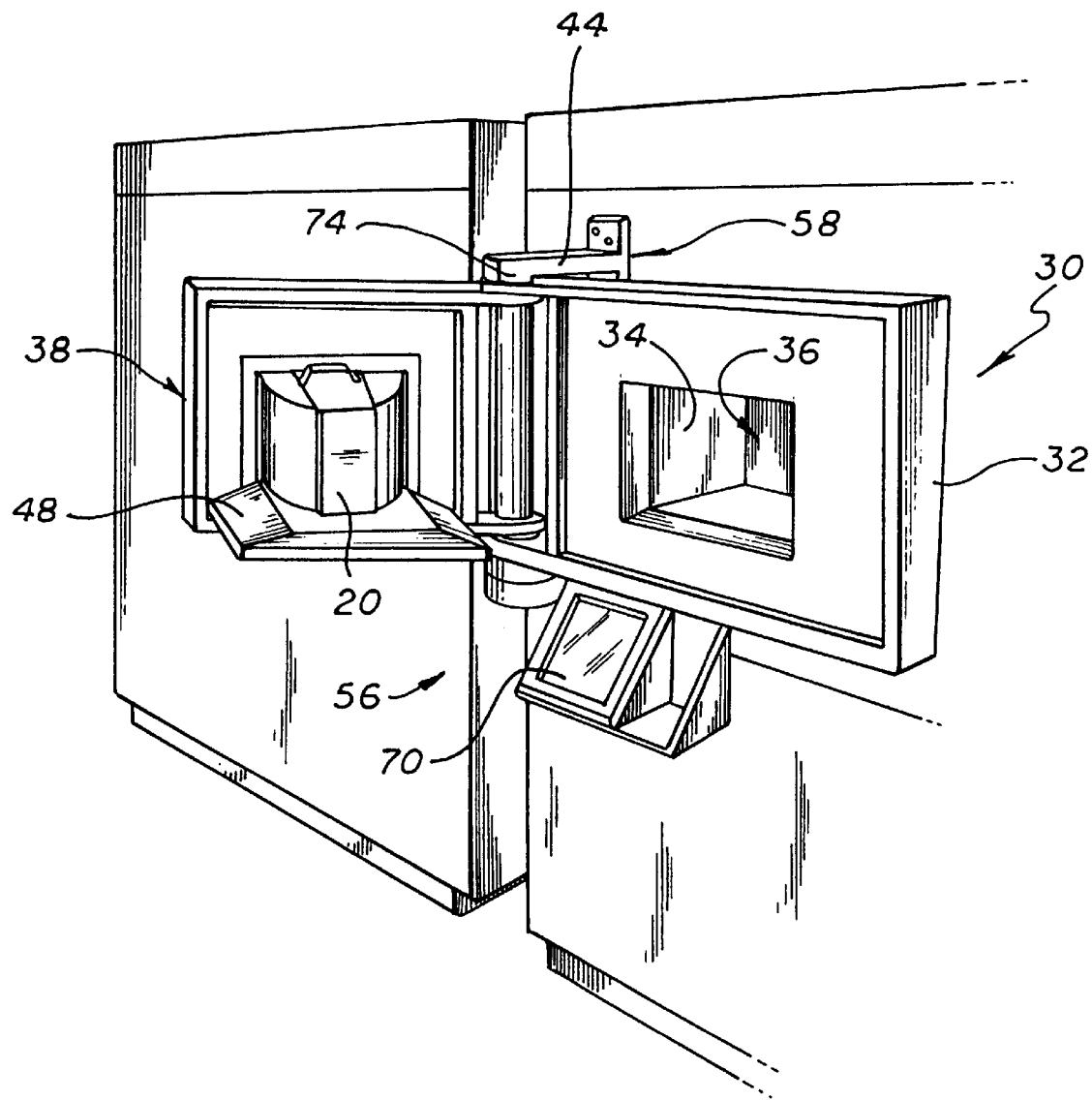
FIG. 5 is a perspective view of a third embodiment of a hinge mounted docking and environmental purging system according to the principles of the invention.
Figure 6:
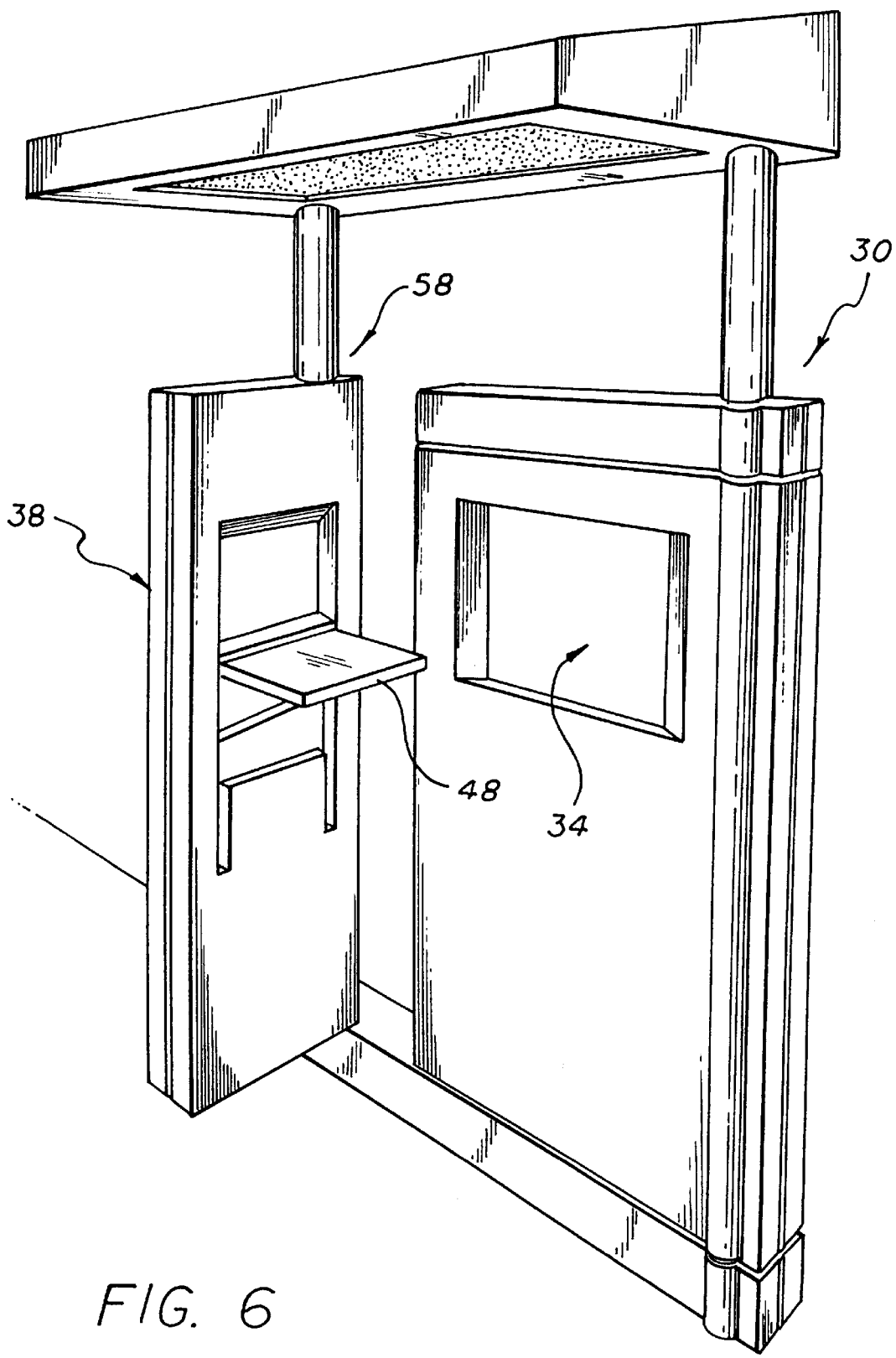
FIG. 6 is a perspective view of a fourth embodiment of a hinge mounted docking and environmental purging system according to the principles of the invention.
Figure 7:
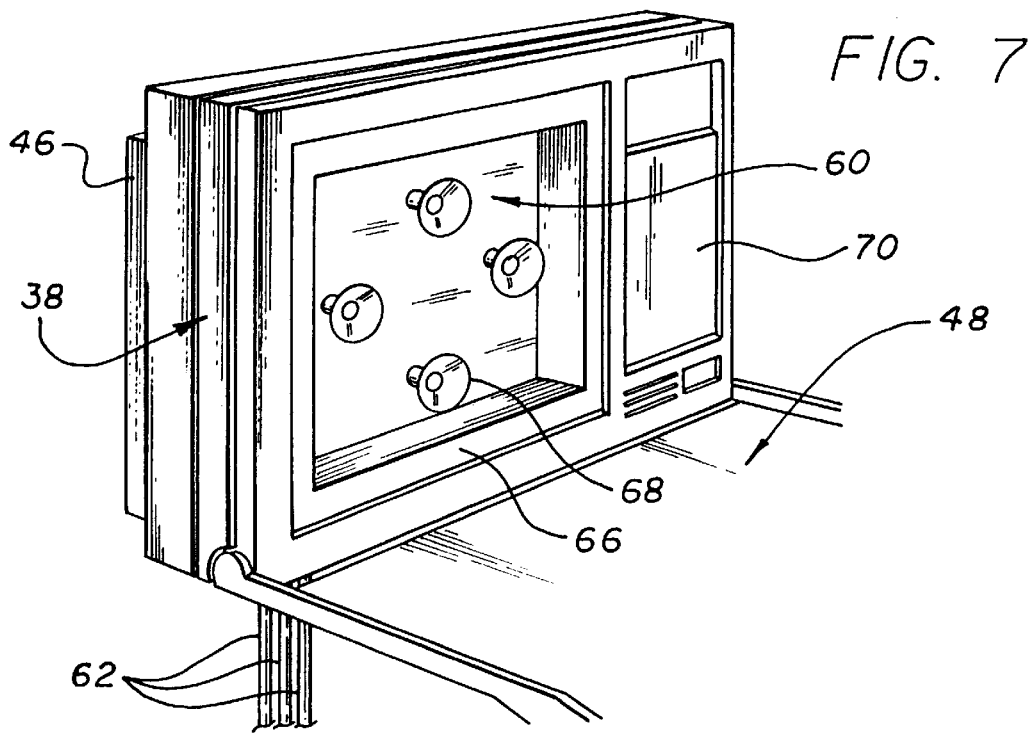
FIG. 7 is a perspective view of a modular isolation door removal panel of a door portion of a docking and environmental purging system according to the principles of the invention.
Figure 8:
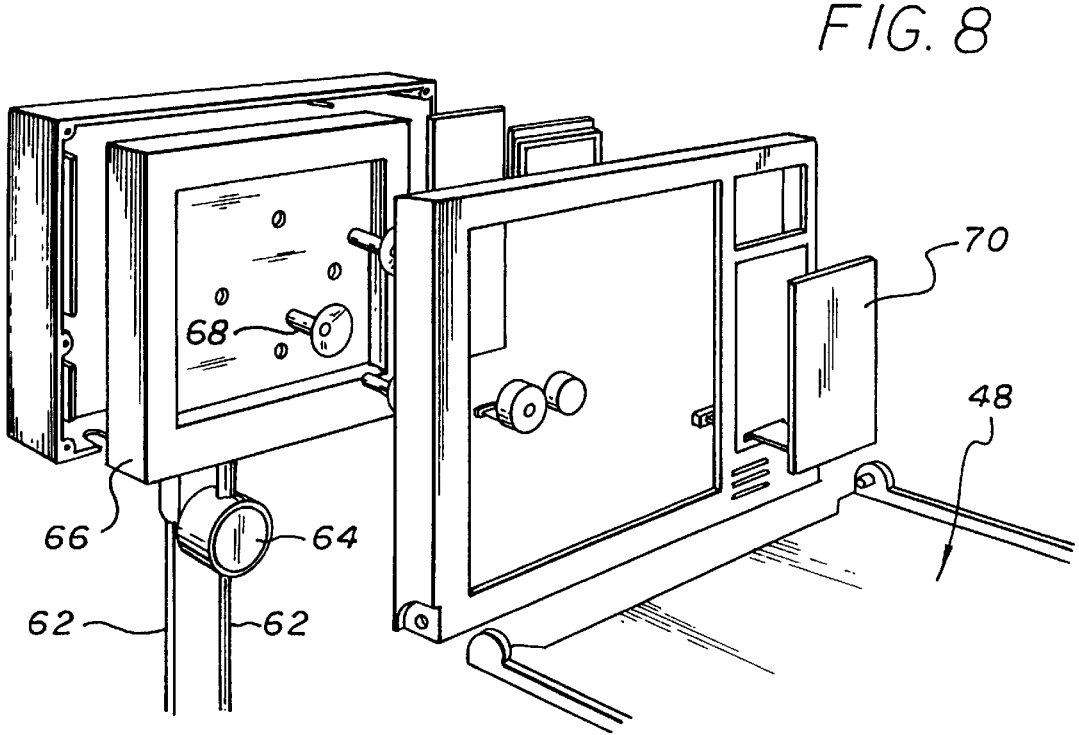
FIG. 8 is an exploded view of the door portion of the docking and environmental purging system of FIG. 7.
Figure 9:
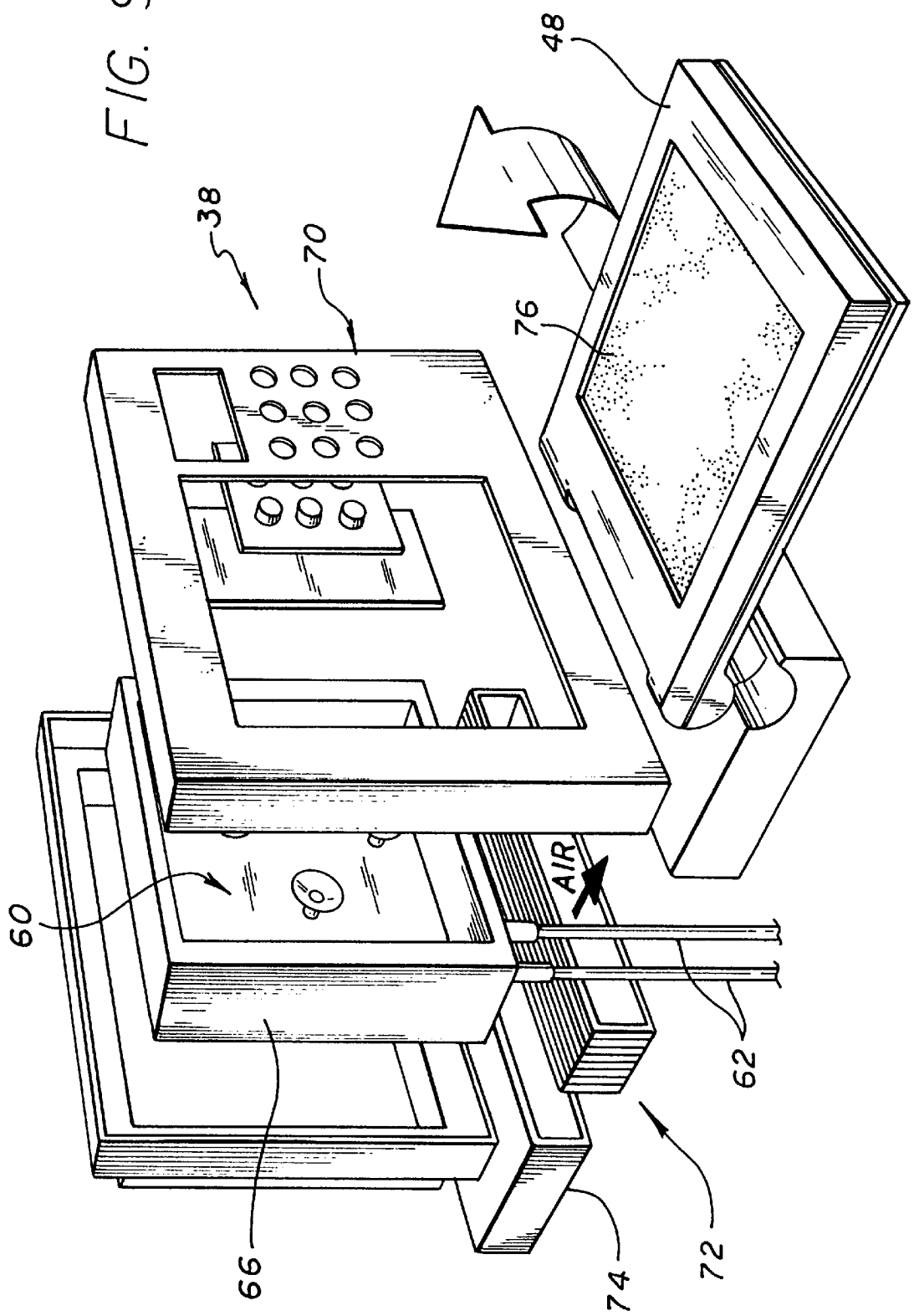
FIG. 9 is an exploded view of an alternative door portion for a docking and environmental purging system according to the principles of the invention.

Means 52 are also provided for supporting and connecting the docking and environment purging system to the processing environment, such as a pole mount 54 adjacent to the window into a wall 56 of the processing clean room as shown in FIGS. 3 and 4. The docking and environment purging system can alternatively be mounted by a hinge mount 58 connected directly to the exterior of a wall of the processing clean room, as shown in FIGS. 5 and 6.

Figure 10:
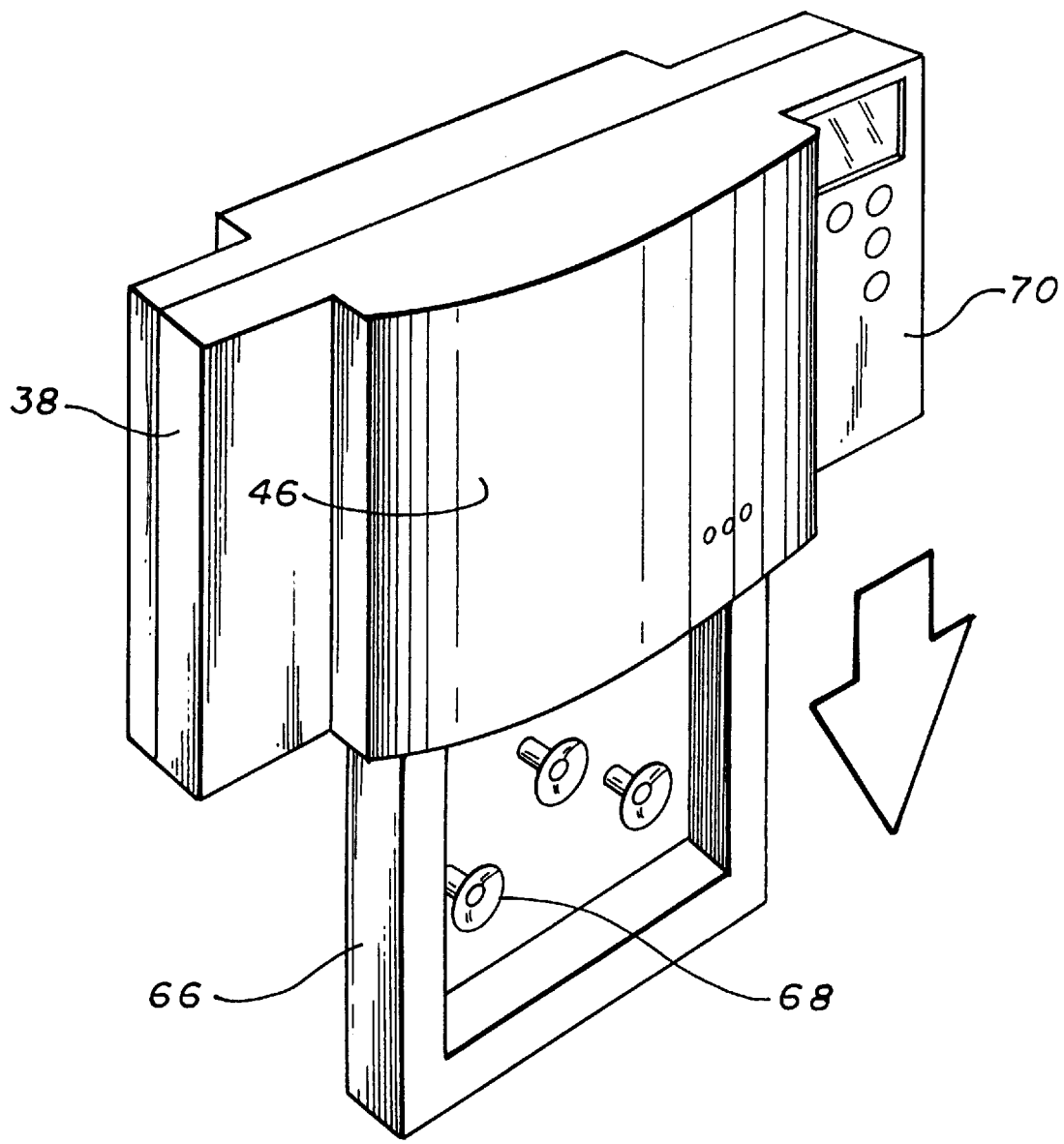
FIG. 10 is a perspective view of a docking and environmental purging system in a door closed position, with the modular isolation container door removal panel lowered to remove the container door.

The door portion of the docking and environment purging system also preferably includes means 60 for removing a modular isolation container door to allow access to the interior chamber when the modular isolation container is disposed in the docking chamber. In one presently preferred embodiment, as illustrated in FIGS. 7 to 10, the means for removing the modular isolation container door comprises a source of vacuum, such as vacuum lines 62 connected to a vacuum pump (not shown), having a vacuum gauge 64 for monitoring the vacuum source, and a hollow vacuum manifold 66 connected to the vacuum lines. The vacuum manifold preferably includes suction cups 68 connected through the vacuum manifold for applying vacuum to the door of the modular isolation container to grip the door, once the modular isolation container is placed on the shelf and positioned adjacent to the suction cups of the vacuum manifold. The vacuum can be activated by an operator by the control keypad 70 located on the housing, once the modular isolation container is in position, to initiate gripping of the modular isolation container door, preparatory to opening the modular isolation container door and initiating the inert gas or filtered air purging of the modular isolation container. To open or remove the modular isolation container door, the vacuum manifold moves from a first closed position of the door typically downward to a second open position for a bottom opening modular isolation container door, as illustrated in FIG. 10, or to a side open position for a side opening modular isolation container door. Alternatively, the modular isolation container door can also be opened manually once the modular isolation container is received on the shelf 48.

The docking and environmental purging system also preferably includes means 72 including associated valving for purging the contents of the docking chamber, including the open modular isolation container, of particulate contaminates. In a presently preferred embodiment, a duct 74 is provided for conducting ambient air through a filter 76 and blower or fan unit 78 to provide a clean purging flow of air to the docking chamber. Alternatively, the duct can provide a flow of clean, inert gas, such as nitrogen gas, for example, for purging the contents of the docking chamber of particulate contaminates. As is shown in FIGS. 3 and 4, the flow of air or inert gas can be ducted through the pole mount, or through the hinge mount support as shown in FIGS. 5 and 6, to vent through the docking chamber or door portion. In one preferred embodiment illustrated in FIG. 9, the filtered air or inert gas purge can be ducted through the door portion and shelf of the docking and environmental purging system. The purging air or gas flow from the docking chamber is typically exhausted through an exhaust vent in the docking chamber and through an exhaust duct (not shown). The control membrane keypad 70 also preferably is operatively connected for controlling the means for purging and the means for removing the modular isolation container door.

Figures 1, 11:
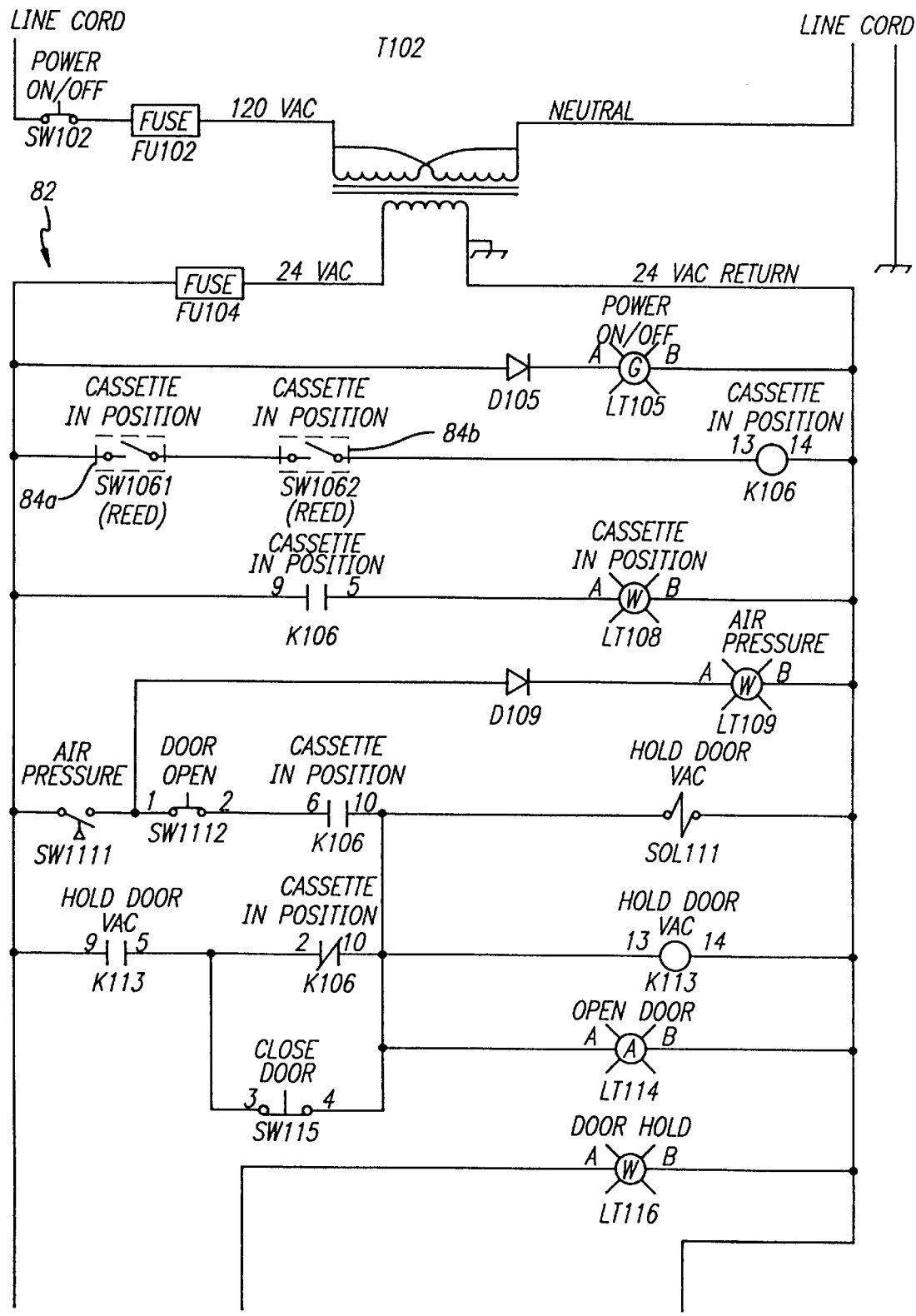
FIG. 11 is a schematic diagram of a valve mechanism controller circuit for the docking and environmental purging system of the invention.
Figures 2, 11:
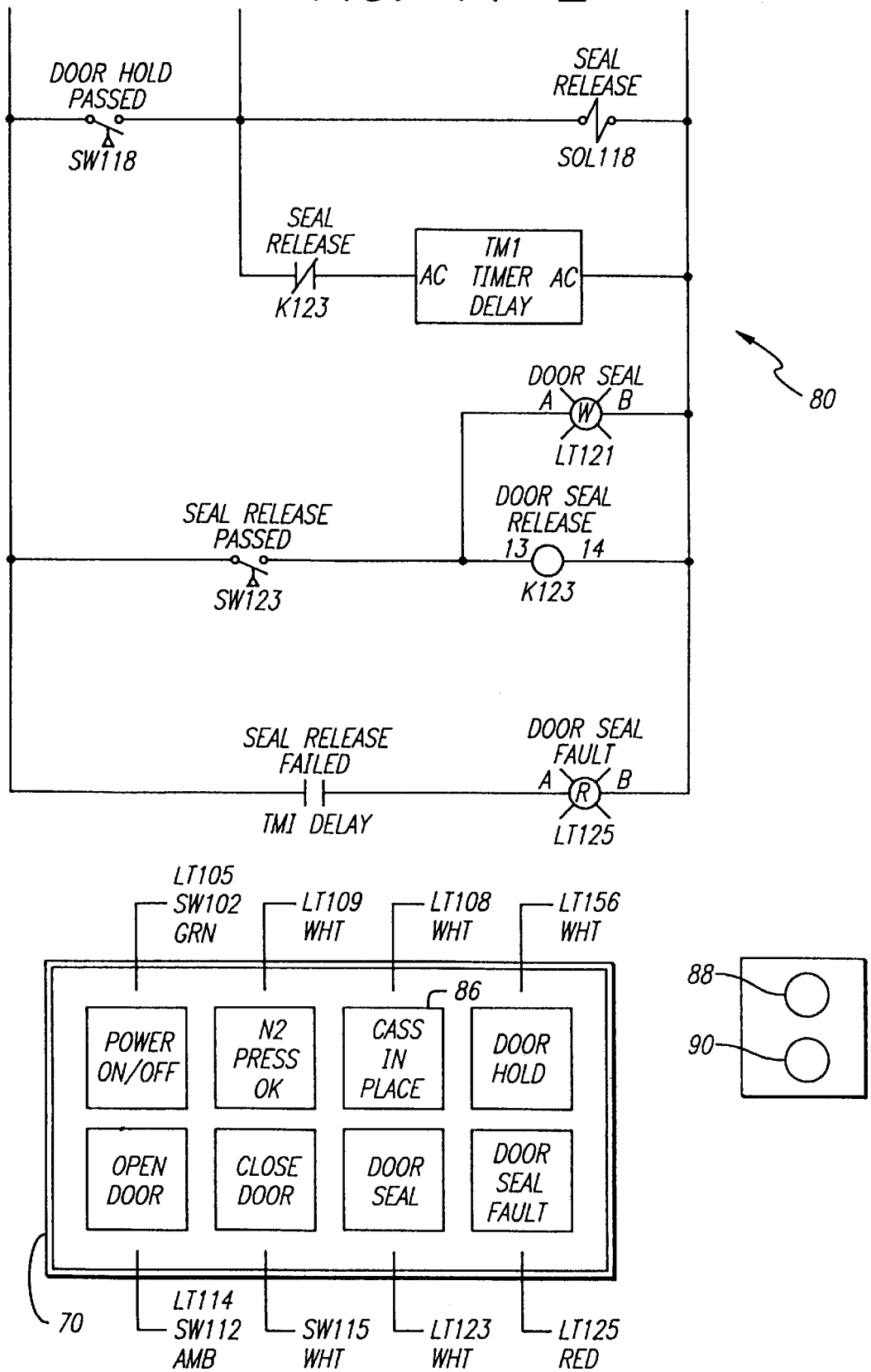

With reference to FIG. 11, control membrane keypad 70 of the docking and environmental purging system can be connected to a control circuit 80. In a presently preferred embodiment, the control circuit includes means 82 for sensing that the modular isolation container is properly received and seated in the docking and environmental purging system, such as for example, sensors 84*a, b* that can be pressure sensitive switches, or contact switches, or the like, located on the shelf 48 or otherwise in the docking chamber, for example. Once the modular isolation container is sensed to be in position, an indicator light 86 switches on, filtered air or inert gas are turned on for purging, and the vacuum for removing and holding the door of the modular isolation container is switched on. A control button 88 can then be pressed for activation of the opening and removal of the isolation container door, while the whole isolation container is held in place, and a control button 90 can be provided for closing and resealing the isolation container door.

It will be apparent from the foregoing that while particular forms of the invention have been illustrated and described, various modifications can be made without departing from the spirit and scope of the invention. Accordingly, it is not intended that the invention be limited, except as by the appended claims.

What is claimed is:

1. A docking and environmental purging system for purging the gas in a modular isolation container and docking the modular isolation container with a processing environment, said modular isolation container having an interior chamber and a door to the interior chamber for sealing the interior chamber, said docking and environmental purging system comprising:

a housing defining a docking chamber for receiving said modular isolation container, said docking chamber being connected to said processing environment; and a vacuum manifold mounted to said housing for opening said modular isolation container door to allow access to said interior chamber when said modular isolation container is disposed in said docking chamber.

2. The docking and environmental purging system of claim 1, wherein said vacuum manifold for opening said modular isolation container door further comprises a suction cup for gripping said modular isolation container door.

3. The docking and environmental purging system of claim 1, further comprising a door portion hingedly mounted to said housing and pivotally moveable between an open position and a closed position sealing said docking chamber, and a shelf mounted to said door portion for receiving said modular isolation container.

4. The docking and environmental purging system of claim 1, further comprising a source of vacuum, said vacuum manifold including a plurality of suction cups connected for communication with said source of vacuum for gripping said modular isolation container door when said modular isolation door is positioned adjacent to said plurality of suction cups.

5. The docking and environmental purging system of claim 1, further comprising a duct connected for receiving a supply of purging gas, a filter for filtering said purging gas, and a blower connected to said docking chamber for fluid communication therewith for purging the gas in said interior chamber.

6. The docking and environmental purging system of claim 5, wherein said purging gas comprises nitrogen.

\* \* \* \* \*

UNITED STATES PATENT AND TRADEMARK OFFICE
CERTIFICATE OF CORRECTION

PATENT NO. : 5,848,933
DATED : Dec. 15, 1998
INVENTOR(S) : Glenn A Roberson, Jr., Robert M. Genco It is certified that error appears in the above-identified patent and that said Letters Patent is hereby corrected as shown below:

Title page, under "FOREIGN PATENT DOCUMENTS", second line, change "1-22429", to read --1-222429--.--.

Signed and Sealed this

Thirtieth Day of March, 1999

Q. TODD DICKINSON

Attest:

Attesting Officer

Acting Commissioner of Patents and Trademarks